(12) United States Patent
Guasti et al.

(10) Patent No.: US 8,724,764 B2
(45) Date of Patent: May 13, 2014

(54) DISTORTION TOLERANT CLOCK AND DATA RECOVERY

(75) Inventors: Giovanni Guasti, Cornaredo (IT); Paolo Novellini, Gorgonzola (IT)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/484,236

(22) Filed: May 30, 2012

(65) Prior Publication Data

US 2013/0321047 A1 Dec. 5, 2013

(51) Int. Cl.
| | | |
|---|---|---|
| H03D 3/24 | (2006.01) | |
| H04L 7/00 | (2006.01) | |
| H04L 7/033 | (2006.01) | |
| H04L 7/02 | (2006.01) | |
| H03K 5/01 | (2006.01) | |

(52) U.S. Cl.
USPC ........... 375/375; 375/373; 375/371; 375/354; 327/165; 327/166; 327/100

(58) Field of Classification Search
USPC ............. 455/126, 91; 330/149, 151; 327/165, 327/100, 166; 375/297, 295, 296, 233, 232, 375/230, 229, 228, 326, 324, 322, 316, 354, 375/371, 373, 375
See application file for complete search history.

(56) References Cited

U.S. PATENT DOCUMENTS

| | | | |
|---|---|---|---|
| 5,301,196 A | | 4/1994 | Ewen et al. |
| 6,531,926 B1 * | | 3/2003 | Pate et al. ................ 331/17 |
| 2005/0046456 A1 * | | 3/2005 | d'Haene et al. ............... 327/165 |
| 2006/0064725 A1 * | | 3/2006 | Rabinowitz et al. ............ 725/68 |
| 2006/0104399 A1 | | 5/2006 | Byun et al. |
| 2007/0057735 A1 * | | 3/2007 | von Kaenel ................... 331/16 |
| 2009/0154626 A1 * | | 6/2009 | Anderson et al. ............ 375/360 |
| 2011/0025913 A1 | | 2/2011 | Sugiyama |
| 2011/0235756 A1 * | | 9/2011 | Ding et al. .................... 375/340 |

FOREIGN PATENT DOCUMENTS

| | | |
|---|---|---|
| EP | 0 758 171 A2 | 2/1997 |
| WO | WO 2010-039108 A1 | 4/2010 |

OTHER PUBLICATIONS

Xilinx, Inc., Novellini, P., et al., "Clock Data Recovery Design Techniques for E1T1 Based on Direct Digital Synthesis," Xilinx XAPP868 (v1.0) Application Note: Virtex and Spartan FPGA Families, Jan. 29, 2008, 11 pgs. Xilinx, Inc., 2100 Logic Drive, San Jose, CA 95124 USA.*

(Continued)

Primary Examiner — Chieh M Fan
Assistant Examiner — Michelle M Koeth
(74) Attorney, Agent, or Firm — Kevin T. Cuenot (57) ABSTRACT

A system can include a phase detector configured to generate a phase error signal indicating a phase error of an input signal compared to an output signal and a first filter coupled to the phase detector and configured to generate a first control signal derived from the phase error signal. The system can include a pattern error detector configured to generate a pattern error signal specifying a pattern error of the input signal compared to the output signal and a second filter coupled to the pattern error detector and configured to generate a second control signal derived from the pattern error signal. The system further can include a controlled oscillator coupled to the first filter and the second filter, wherein the controlled oscillator is configured to generate the output signal responsive to the first control signal, the second control signal, and a center frequency signal.

8 Claims, 7 Drawing Sheets

(56) References Cited

OTHER PUBLICATIONS

Xilinx, Inc., Novellini, P., et al., "Clock Data Recovery Design Techniques for E1T1 Based on Direct Digital Synthesis," Xilinx XAPP868 (v1.0) Application Note: Virtex and Spartan FPGA Families, Jan. 29, 2008, 11 pgs. Xilinx, Inc., 2100 Logic Drive, San Jose, CA 95124 USA.*

Xilinx, Inc., Novellini, P., et al., "Dynamically Programmable DRU for High-Speed Serial I/O," Xilinx XAPP875 (v1.0) Application Note: Virtex-5 FPGAs, Mar. 9, 2009, 14 pgs. Xilinx, Inc., 2100 Logic Drive, San Jose, CA 95124 USA.

* cited by examiner

DISTORTION TOLERANT CLOCK AND DATA RECOVERY

FIELD OF THE INVENTION

One or more embodiments disclosed within this specification relate to clock and data recovery within a system. More particularly, one or more embodiments relate to clock and data recovery that is tolerant to various forms of distortion.

BACKGROUND

Many transmitters are constructed in a manner that results in a known type of distortion appearing in the signals that are output. For example, many transmitters can be characterized by the presence of deterministic distortion in the phase of the signals that are output. Periodic distortion is one type of deterministic distortion caused by a Periodically Distorted Unit Interval (PDUI). With deterministic distortion caused by a PDUI, each edge of the signal is always affected by a phase error that can be defined by a discrete function phase(k), where "k" is the edge number of the signal. A signal affected by a PDUI has a periodic phase(k). The size of the period can be one or more unit intervals (UIs).

Available clock and data recovery (CDR) systems are able to account for some types of distortion, but remain largely intolerant to others. For example, conventional CDR systems are often able to correct for non-deterministic distortion, e.g., jitter, but are not optimized to correct for deterministic distortion.

SUMMARY

One or more embodiments disclosed within this specification relate to clock and data recovery within a system and, more particularly, to clock and data recovery that is tolerant to various forms of distortion.

An embodiment can include a system. The system can include a phase detector configured to generate a phase error signal indicating a phase error of an input signal compared to an output signal and a first filter coupled to the phase detector that is configured to generate a first control signal derived from the phase error signal. The system also can include a pattern error detector configured to generate a pattern error signal specifying a pattern error of the input signal compared to the output signal and a second filter coupled to the pattern error detector that is configured to generate a second control signal derived from the pattern error signal. The system further can include a controlled oscillator coupled to the first filter and the second filter. The controlled oscillator can be configured to generate the output signal responsive to the first control signal, the second control signal, and a center frequency signal.

Another embodiment can include a method. The method can include determining a phase error for an input signal compared to an output signal, generating a first control signal from the phase error, determining a pattern error for the input signal compared to the output signal, and generating a second control signal from the pattern error. The method also can include using a controlled oscillator, generating the output signal responsive to the first control signal and the second control signal. The output signal can specify a clock signal recovered from the input signal that is independent of transition density of the input signal.

Another embodiment can include a controlled oscillator circuit. The controlled oscillator circuit can include an adder configured to add a first control signal, at least one bit from an output signal, and an adjusted center frequency signal and generate a sum. The circuit also can include an accumulator coupled to the adder and configured to generate the output signal. The oscillator further can include a center frequency adjustment module configured to adjust the center frequency according to a pattern error.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to clock and data recovery (CDR) within a system and, more particularly, to CDR that is tolerant to various forms of distortion. The inventive arrangements disclosed within this specification can maximize high frequency distortion tolerance when the incoming signal, e.g., data, exhibits various forms of deterministic distortion. Deterministic distortion, in general, refers to non-random distortion. One type of deterministic distortion can include pattern-based distortion. Pattern-based distortion can include, or refer to, distortion that repeats a particular design or follows a known model.

A CDR system configured in accordance with one or more embodiments disclosed within this specification can be tolerant to non-deterministic distortion as well as deterministic distortion, including deterministic distortion that follows a pattern, e.g., is pattern-based. Another example of deterministic distortion is unit interval (UI) periodic distortion. UI periodic distortion can occur as a consequence of the transmitter. In general, a UI refers to the minimum time interval between condition changes of a data transmission signal, also known as the pulse time or symbol duration time. For example, the unit interval refers to one cycle of the clock signal that is to be recovered from a received data signal.

Figure 1:
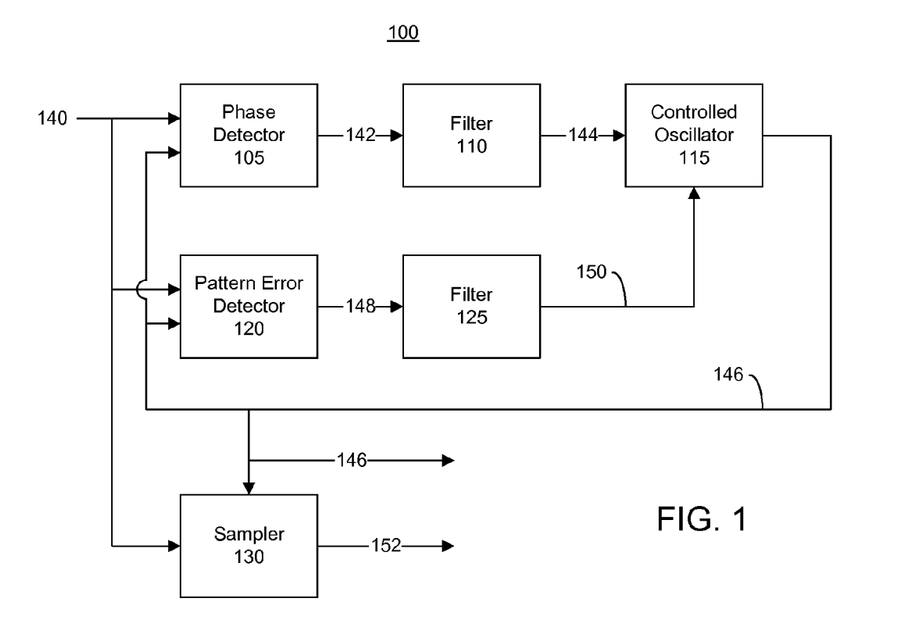
FIG. 1 is a block diagram illustrating a system for clock and data recovery in accordance with an embodiment disclosed within this specification.

FIG. 1 is a block diagram illustrating a system 100 for CDR in accordance with an embodiment disclosed within this specification. System 100 is configured to recover a clock signal, e.g., output signal 146, from an input data signal, e.g., input signal 140. The recovered clock signal will have the same distortion as the input data signal. As such, the recovered clock signal can be used to accurately sample the incoming data signal for use in further processing.

As pictured, system 100 includes a phase detector 105, a filter 110 (e.g., a first filter), a controlled oscillator 115, a pattern error detector 120, a filter 125 (e.g., a second filter), and a sampler 130. Phase detector 105 and pattern error detector 120 each can receive input signal 140. Phase detector 105 can be configured to compare input signal 140 with output signal 146, which is obtained from an output of controlled oscillator 115. As shown, output signal 146 is fed back to an input of phase detector 105. Phase detector 105 can compare each transition of input signal 140 with an expected phase value as determined from output signal 146 from controlled oscillator 115. Phase detector 105 can be configured to compare the phase of input signal 140 with the phase of output signal 146 and generate a phase error signal 142. Phase error signal 142, in general, specifies the phase difference between input signal 140 and output signal 146.

Filter 110 is coupled to phase detector 105 and, as such, receives phase error signal 142 as an input. In one aspect, filter 110 can be implemented in the form of a "loop filter." In general, a loop filter refers to a type of filter that can be a simple resistor-capacitor (RC) filter or can include an amplifier, and which passes the original modulating frequencies but removes the carrier-frequency components and harmonics from a frequency modulated signal in a locked-oscillator detector. Typically, a loop filter is implemented as a low pass filter.

For example, filter 110 can be used to control loop dynamics or stability. In this regard, filter 110 can control how the loop (e.g., phase detector 105, filter 110, and controlled oscillator 115) responds to disturbances in input signal 140 and the amount of time for the loop to achieve lock. Filter 110 further can be used to limit the amount of energy from phase error signal 142 that is permitted to reach the input of controlled oscillator 115. In any case, filter 110 can generate a filtered version of phase error signal 142, referred to as filtered phase error signal 144. Filtered phase error signal 144 can be provided to controlled oscillator 115 as a first control signal.

Pattern error detector 120 can be configured to compare input signal 140 with output signal 146 to determine a pattern-based error in input signal 140. As shown, output signal 146 is fed back to an input of pattern error detector 120. In one example, pattern error detector 120 can be configured to compare the periodic UI of input signal 140 with the periodic UI of output signal 146 and generate pattern error signal 148 in response to the comparison. Pattern error signal 148 can specify the difference in pattern error, e.g., the periodic UI in one illustration, between input signal 140 and output signal 146.

Filter 125 is coupled to pattern error detector 120 and, as such, receives pattern error signal 148 as an input. Filter 125 can be implemented substantially as described with reference to filter 110. It should be appreciated, however, that while filter 125 can be a "loop filter" such as a low pass filter, since the particular signal upon which filter 125 operates differs from the signal upon which filter 110 operates, filter 125 need not be identical to filter 110 in terms of operational parameters. Filter 125 can control how the loop (e.g., a second and different loop formed of pattern error detector 120, filter 125, and controlled oscillator 115) responds to disturbances in the input signal 140 and the amount of time required to achieve lock. Filter 125 can generate a filtered version of pattern error signal 148, referred to as filtered pattern error signal 150. Filtered pattern error signal 150 can be provided to controlled oscillator 115 as a second control signal.

Controlled oscillator 115 receives filtered phase error signal 144 and filtered pattern error signal 150 as first and second control signals, respectively. Controlled oscillator 115, responsive to the control signals, generates output signal 146. As shown, output signal 146 can be provided to one or more other systems and specifies the clock signal recovered from input signal 140. Output signal 146 further can be provided to sampler 130 as a control or clock signal.

Sampler 130, which also receives input signal 140, can sample input signal 140 responsive to output signal 146. Output signal 146 can be used to clock sampler 130. Sampler 130 can output a data signal 152, which can be the data recovered from input signal 140, e.g., sampled values. Because output signal 146 exhibits the same distortion as input signal 140, sampler 130 can operate upon, e.g., sample, input data signal 140 at a location that is at the center of the data. In general, system 100 can position the recovered clock phase independently of the transition probability of input signal 140, thereby providing optimal distortion tolerance despite the presence of deterministic distortion in input signal 140. As noted, one variety of deterministic distortion includes a Periodically Distorted Unit Interval (PDUI). System 100 can provide deterministic distortion tolerance despite signal transition density.

As discussed, a conventional CDR system assumes that the function for phase error on input signal 140, denoted as phase (k) where "k" indicates the edge number of the signal, has a period equivalent to 1 UI. When phase(k) does have a period equal to 1 UI, the PDUI distortion is negligible compared to the UI. In cases where phase(k) has a period of 2 or more, the PDUI distortion is not negligible compared to the UI and the conventional CDR system becomes intolerant to the pattern-based, or deterministic, distortion. For example, when input signal 140 is affected by a 2 UI PDUI, the phase error occurs every two UIs.

A transition refers to a rising edge or a falling edge of a signal. The transition density of a signal refers to the locations in time of the transitions of the signal. The location in time is typically measured or determined according to the recovered clock signal, where clock cycles can be sequentially numbered using integer values. Input signal 140 can transition on either an even edge of the recovered clock signal or an odd edge of the recovered clock signal. A balanced transition density refers to a signal having equal or substantially equal transitions on even edges (referred to as an even transition) as on odd edges (referred to as an odd transition).

As used within this specification, a "tolerance" to a particular type of distortions refers to the ability of the system to adapt or correct for the distortion by adjusting the location of the recovered clock edges to be at the center of the data. Clock edges (i.e., the recovered clock signal) are positioned at substantially the midpoint or centered between two consecutive transitions of the data signal. A system that is "not tolerant" or that is "intolerant" is unable to correct for distortion in the data signal and, as a result, places the edges of the clock signal at locations that are not midway or centered between two consecutive transitions of the data signal.

In the case where input signal 140 has a balanced transition density, e.g., when the transitions of input signal 140 have equal probability of occurring on an odd edge as an even edge, a conventional CDR system can converge to a phase that is tolerant to deterministic distortion. In cases where input signal 140 has an imbalanced transition density, e.g., a transition does not have an equal probability of occurring on an odd edge as an even edge, a conventional CDR system converges to a phase that is intolerant to deterministic distortion, e.g., exhibits sub-optimal distortion tolerance. In this case, a conventional CDR system recovers a clock signal that, if used to clock sampler 130, would have (clock) edges in positions that are non-optimal for sampling input signal 140, thereby increasing the likelihood of sampling incorrect values from input signal 140.

When input signal 140 has no deterministic distortion, e.g., pattern-based distortion such as periodic distortion on the UI, system 100 can operate substantially the same as, or similar to, a conventional CDR system. Similarly, when input signal 140 has deterministic distortion, e.g., pattern-based distortion such as periodic distortion on the UI, but the transition density is balanced, system 100 can operate substantially the same as a conventional CDR system.

When input signal 140 has periodic distortion and the transition density is not balanced, however, system 100 can generate a clock signal, e.g., output signal 146, with edges in an optimal placement for sampling input signal 140. More particularly, the edges of the recovered clock signal will be located in the center of the data of input signal 140 (e.g., midway or centered between transitions), thereby resulting in accurate sampling by sampler 130. Thus, when input signal 140 has deterministic distortion and the transition density is not balanced, system 100 can position recovered clock phase independently of the transition probability.

A conventional CDR system, being intolerant to such deterministic distortion, will generate a recovered clock signal likely resulting in the sampler generating incorrect values for input signal 140. The conventional CDR system presumes, for example, that the phase error in received signals has a period of one UI. Thus, conventional CDR systems are largely intolerant and unable to accommodate data signals in which the period of the phase error is greater than one UI as such systems typically sample the received data signal with samples that are equally spaced in time.

The loop formed of pattern error detector 120, filter 125, and controlled oscillator 115, in general, can continually compare the deterministic distortion on the incoming data with the distortion on output signal 146 and force the distortion on output signal 146 to converge to the same level or amount of distortion as is detected on input signal 140.

Figure 2:
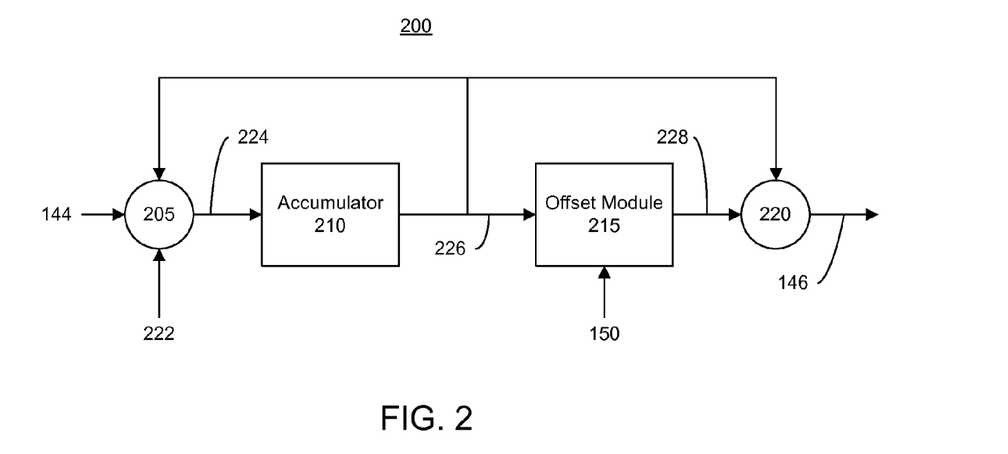
FIG. 2 is a block diagram illustrating an exemplary implementation of a controlled oscillator in accordance with another embodiment disclosed within this specification.

FIG. 2 is a block diagram illustrating an exemplary implementation of a controlled oscillator 200 in accordance with another embodiment disclosed within this specification. Controlled oscillator 200 can be used to implement controlled oscillator 115 of FIG. 1 in the case of an input signal having a 2UI PUID type of pattern-based, or deterministic, distortion. Referring to FIG. 2, controlled oscillator 200 can include an adder 205, an accumulator 210, an offset module 215, and an adder 220. Like numbers will be used to refer to the same items throughout this specification.

Adder 205 can receive filtered phase error signal 144, a center frequency signal 222, and an accumulation signal 226 that is output from accumulator 210. In the example pictured in FIG. 2, the center frequency value specified by center frequency signal 222 is approximately one half of the desired center frequency of controlled oscillator 200. It should be appreciated, however, that the value specified by center frequency signal 222 is dependent upon the particular architecture used to implement controlled oscillator 200 and, as such, is not intended as a limitation of the one or more embodiments disclosed within this specification. Adder 205 can sum filtered phase error signal 144, center frequency signal 222, and an accumulation signal 226 and generate sum signal 224. Adder 205 outputs sum signal 224 to accumulator 210, which receives sum signal 224 as an input.

In general, accumulator 210 can be implemented as a register, or portion of memory with suitable circuitry, in which the result of an arithmetic or logical operation is performed. For example, on each clock cycle of a reference clock (not shown), the value specified by sum signal 224 can be added to the value stored within accumulator 210, which is an ongoing sum of the value specified by sum signal 224 for each of a plurality of earlier, e.g., prior, reference clock cycles. The value of accumulator 210 can be specified by accumulation signal 226, which is output from accumulator 210 as shown. Accumulation signal 226 can specify a first phase, e.g., phase A, that does not account for deterministic distortion.

Offset module 215 can be configured to receive accumulation signal 226 from accumulator 210 and filtered pattern error signal 150. Offset module 215, in general, adjusts, e.g., increases, the value of received accumulation signal 226 by the amount specified by filtered pattern error signal 150. Offset module 215 outputs a signal 228, which is the adjusted version of accumulation signal 226. Signal 228, in effect, specifies a second phase, e.g., phase B, which does account for deterministic distortion unlike accumulation signal 226.

Adder 220 can receive accumulation signal 226 and adjusted accumulation signal 228, e.g., phases A and B, and sum the signals to generate output signal 146. Output signal 146 specifies the clock signal recovered from received data, e.g., input signal 140, that can be used to accurately sample the received data.

Figure 3:
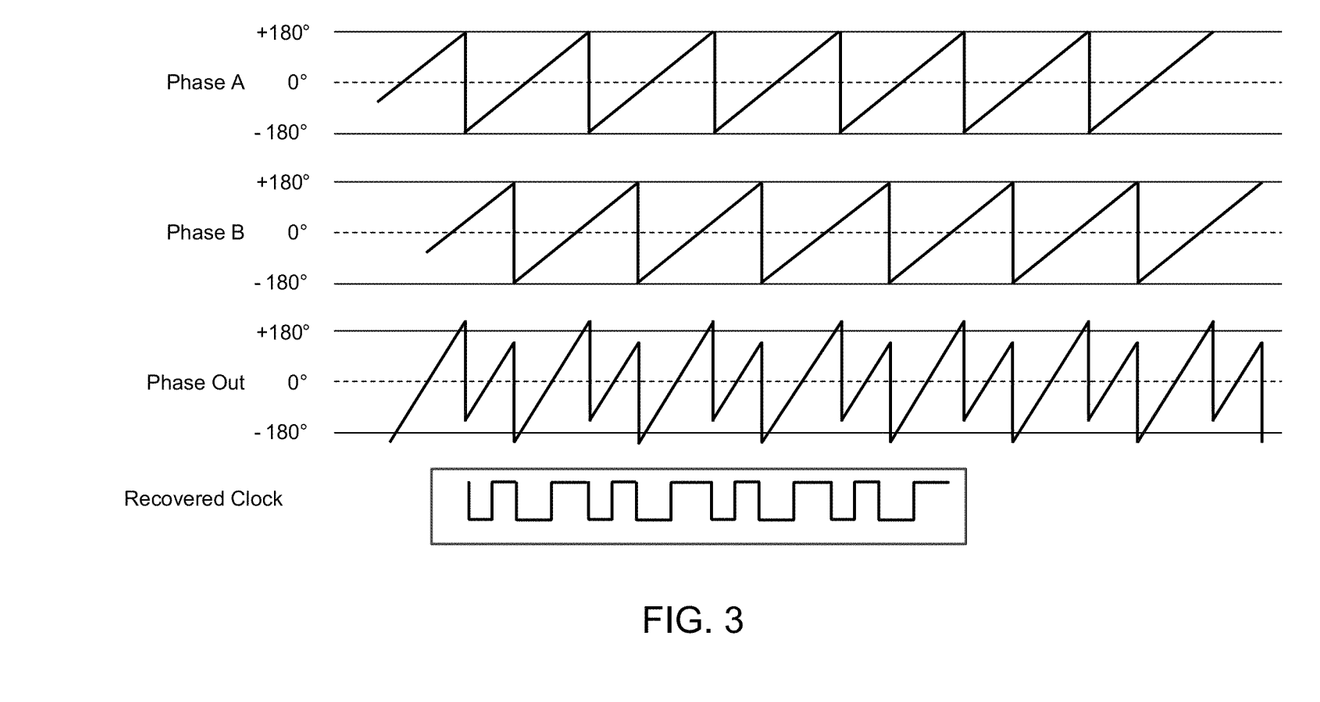
FIG. 3 is a signal diagram illustrating a recovered clock signal in accordance with another embodiment disclosed within this specification.

FIG. 3 is a signal diagram illustrating a recovered clock signal in accordance with another embodiment disclosed within this specification. FIG. 3 illustrates a waveform corresponding to phase A (signal 226 of FIG. 2) and a waveform corresponding to phase B (signal 228 of FIG. 2). The resulting phase from summing phase A and phase B together is illustrated as phase out (signal 146). The recovered clock signal, as determined using phase out, is also illustrated. The recovered clock is recovered, e.g., determined, by the Most Significant Bit of the phase out signal. As illustrated, the recovered clock has a value of 1 (e.g., logic high) when the phase of phase out is positive. The recovered clock has a value of 0 (e.g., a logic low) when the phase out is negative. The recovered clock signal has deterministic distortion that matches, or is substantially the same as, that of the received input signal.

Figure 4:
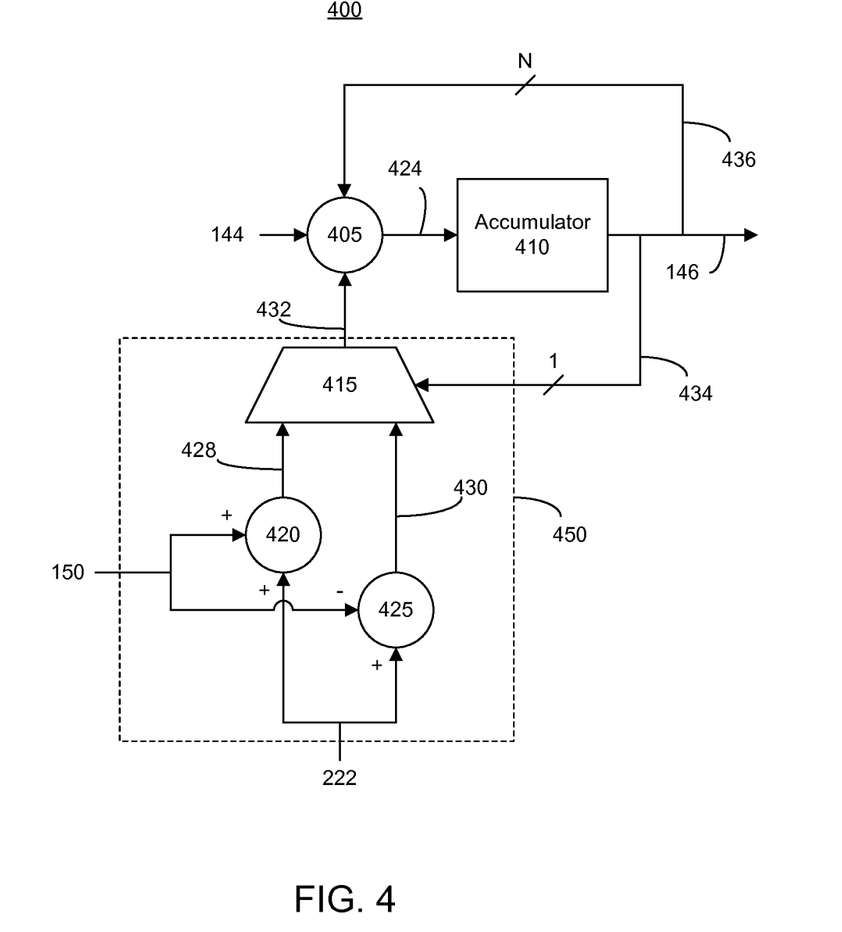
FIG. 4 is a block diagram illustrating an exemplary implementation of a controlled oscillator in accordance with another embodiment disclosed within this specification.

FIG. 4 is a block diagram illustrating an exemplary implementation of a controlled oscillator 400 in accordance with another embodiment disclosed within this specification. Controlled oscillator 400 can be used to implement controlled oscillator 115 of FIG. 1. FIG. 4 illustrates a controlled oscillator implementation that can be used to accommodate, or correct, for pattern-based distortion such as 2 UI periodic distortion or 2-bit distortion.

As shown, controlled oscillator 400 can include an adder 405, an accumulator 410, and a center frequency adjustment module 450. Center frequency adjustment module 450 can include a multiplexer 415, an adder 420, and a difference module 425. Rather than using a fixed center frequency, controlled oscillator 400 utilizes an adjusted center frequency as generated by center frequency adjustment module 450. In general, the center frequency is adjusted upward and downward. Though upwardly and downwardly adjusted center frequency values are used, the average of the adjusted center frequency values is the value of the center frequency (unadjusted).

Adder 405 can receive filtered phase error signal 144, an output signal 432 from multiplexer 415, and signal 436 taken from the output of accumulator 410. Adder 405 can sum filtered phase error signal 144, signal 432, and signal 436, and generate sum signal 424, which can be provided to accumulator 410 as input. Accumulator 410 can be implemented as described with reference to FIG. 2 and generate output signal 146. N-bits of signal 146, referred to as signal 436, are provided back to adder 405 as an input. Output signal 146 can specify a phase of N+1 bits, in which "N" specifies the number of UIs of the controlled distortion, e.g., two in this example.

Regarding center frequency adjustment module 450, adder 420 is configured to receive filtered pattern error signal 150 and center frequency signal 222 as inputs. In the example pictured in FIG. 4, signal 222 can specify the actual value of the desired center frequency of controlled oscillator 400 as opposed to a fraction thereof as in the case of FIG. 2.

Adder 420 can generate signal 428, which is the sum of filtered pattern error signal 150 and center frequency signal 222, and provide signal 428 to multiplexer 415. Difference module 425 can receive filtered error pattern signal 150 and center frequency signal 222. Difference module 425 can subtract filtered error pattern signal 150 from center frequency signal 222. Difference module 425 can generate signal 430 as output, which indicates the difference that is computed. Appreciably, signal 428 specifies a larger value than signal 430.

Multiplexer 415 can select either signal 428 or signal 430 and pass the selected signal as signal 432 to adder 405. In one aspect, multiplexer 415 can receive signal 434 as a control signal that specifies whether signal 428 or signal 430 is the selected signal. For example, signal 434 can be the most significant bit of signal 146. On even cycles of the recovered clock signal, signal 430 can be selected and used by adder 405. On odd cycles of the recovered clock signal, signal 428 can be selected and used by adder 405. It should be appreciated that that when filtered pattern error signal 150 is zero, signal 428 is equivalent to signal 430. Thus, multiplexer 415 passes signal 428 in a first UI, signal 430 in a second UI, signal 428 in a third UI, and so fort in alternating fashion changing for each UI in accordance with signal 434.

Referring to FIG. 4, each of signals 428 and 430 can be considered a candidate signal specifying an adjusted version of center frequency signal 222. Similarly, signal 432, which alternates between signal 428 and signal 430 depending upon control signal 434, also is the "adjusted" center frequency signal utilized by controlled oscillator 400. As discussed, the average of signals 428 and 430 (or the average of signal 432) results in the value of center frequency signal 222.

Figure 5:
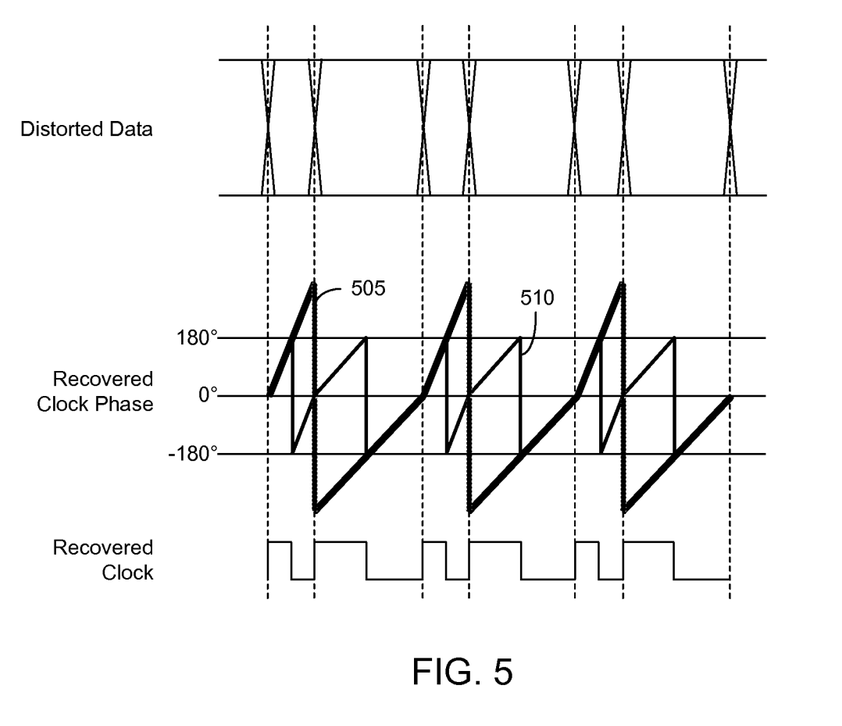
FIG. 5 is a signal diagram illustrating a recovered clock signal in accordance with another embodiment disclosed within this specification.

FIG. 5 is a signal diagram illustrating a recovered clock signal in accordance with another embodiment disclosed within this specification. FIG. 5 illustrates received distorted data from an input signal, e.g., input signal 140 and the recovered clock phase from the data as determined in accordance with an embodiment using controlled oscillator 400, for example. The recovered clock signal is also shown.

As illustrated, bold line 505 illustrates the most significant bit of output signal 146, which is used to drive multiplexer 415 of FIG. 4. The non-bolded line labeled 510 is the second most significant bit. As illustrated, the recovered clock is derived from line 510 in that the recovered clock is high when line 510 is positive and low when line 510 is negative.

Figure 6:
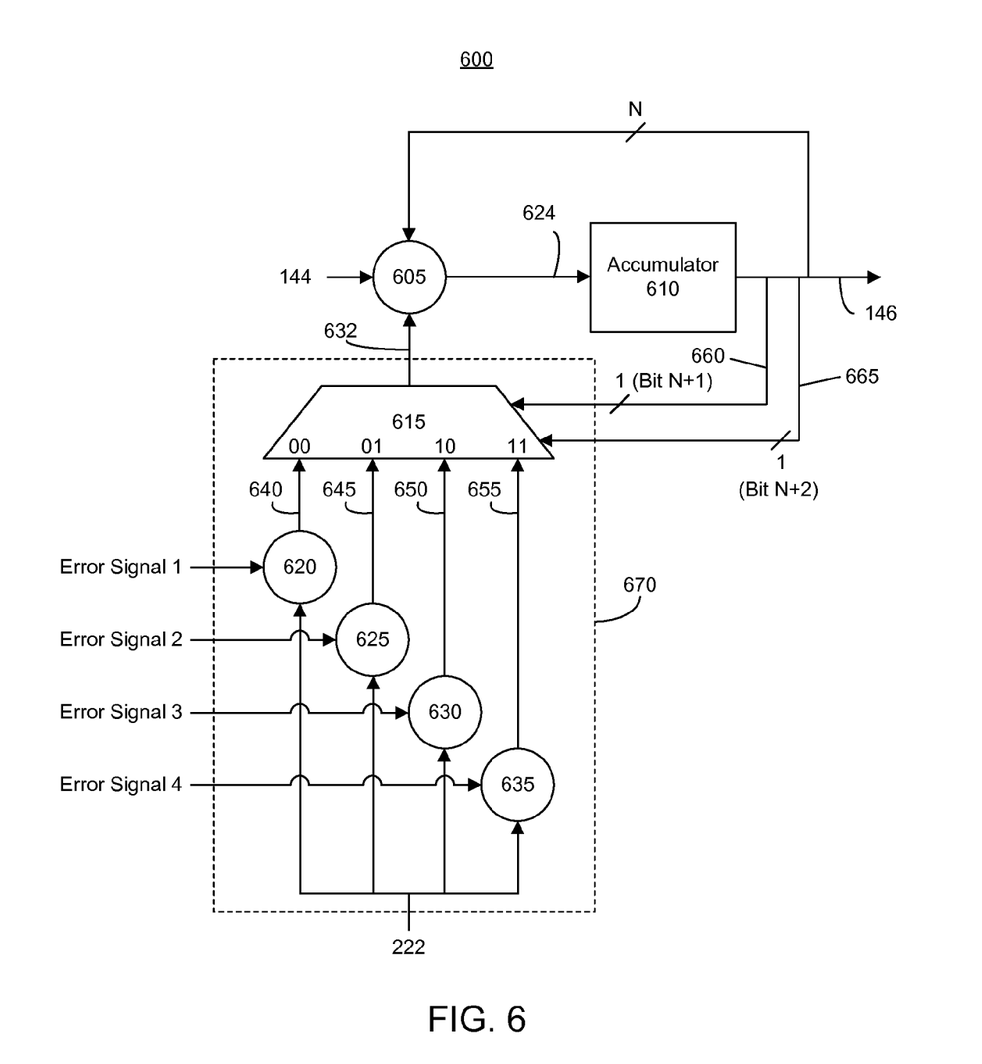
FIG. 6 is a block diagram illustrating an exemplary implementation of a controlled oscillator in accordance with another embodiment disclosed within this specification.

FIG. 6 is a block diagram illustrating an exemplary implementation of a controlled oscillator 600 in accordance with another embodiment disclosed within this specification. Controlled oscillator 600 can be used to implement controlled oscillator 115 of FIG. 1. FIG. 6 illustrates a controlled oscillator implementation that can be used to accommodate, e.g., correct, for $2^m$ UI periodic distortion. The example illustrated in FIG. 6 relates to 4 UI periodic distortion, e.g., where m=2.

Controlled oscillator 600 can include an adder 605, an accumulator 610, and a center frequency adjustment module 670, which includes a multiplexer 615, adders 620, 625, 630, and 635. Each of adders 620-635 can be configured to receive center frequency signal 222 as an input and an error signal. As pictured, adder 620 can receive error signal 1. Adder 625 can receive error signal 2. Adder 630 can receive error signal 3. Adder 635 can receive error signal 4.

In one aspect, each error signal can specify an error, e.g., an offset, for a different type of deterministic distortion. For example, each error signal can specify an error adjustment for a selected type of pattern-based distortion. In illustration, error signal 1 can specify an error for UI distortion having a UI of 1. Error signal 2 can specify an error for UI distortion having a UI of 2. Error signal 3 can specify an error for UI distortion having a UI of 3. Error signal 4 can specify an error for UI distortion having a UI of 4.

Adder 620 is configured to sum center frequency signal 222 and error signal 1. Adder 620 generates and outputs signal 640 specifying the sum of center frequency signal 222 and error signal 1. Adder 625 is configured to sum center frequency signal 222 and error signal 2. Adder 625 generates and outputs signal 645 specifying the sum of center frequency signal 222 and error signal 2. Adder 630 is configured to sum center frequency signal 222 and error signal 3. Adder 630 generates and outputs signal 650 specifying the sum of center frequency signal 222 and error signal 3. Adder 635 is configured to sum center frequency signal 222 and error signal 4. Adder 635 generates and outputs signal 655 specifying the sum of center frequency signal 222 and error signal 4.

Multiplexer 615 receives two signals 660 and 665 as control signals that indicate which of signals 640-655 are to be passed as signal 632. Signal 660 can be the most significant bit of output signal 146. Signal 665 can be the second most significant bit of output signal 146. Responsive to both signals 660 and 665 being logic zero, multiplexer 615 passes signal 640 in the form of signal 632. Responsive to signal 660 being a logic zero and signal 665 being a logic one, multiplexer 615 passes signal 645 in the form of signal 632. Responsive to signal 660 being a logic one and signal 665 being a logic zero, multiplexer 615 passes signal 650 in the form of signal 632. When both signal 660 and signal 665 are logic ones, multiplexer 615 passes signal 655 in the form of signal 632.

Each of signals 640-655 can be considered an adjusted version of center frequency signal 222. As such, each is a candidate that is selected by multiplexer 615 and, when selected, is passed as the "adjusted" center frequency signal labeled signal 632.

While FIG. 6 is illustrates the case in which the period of 4 UI distortion is addressed, controlled oscillator 600 can be extended to any integer period by expanding center frequency adjustment module 670 through the inclusion of additional adders. Each additional adder can receive a further error signal that is to be added to center frequency signal 222.

Figure 7:
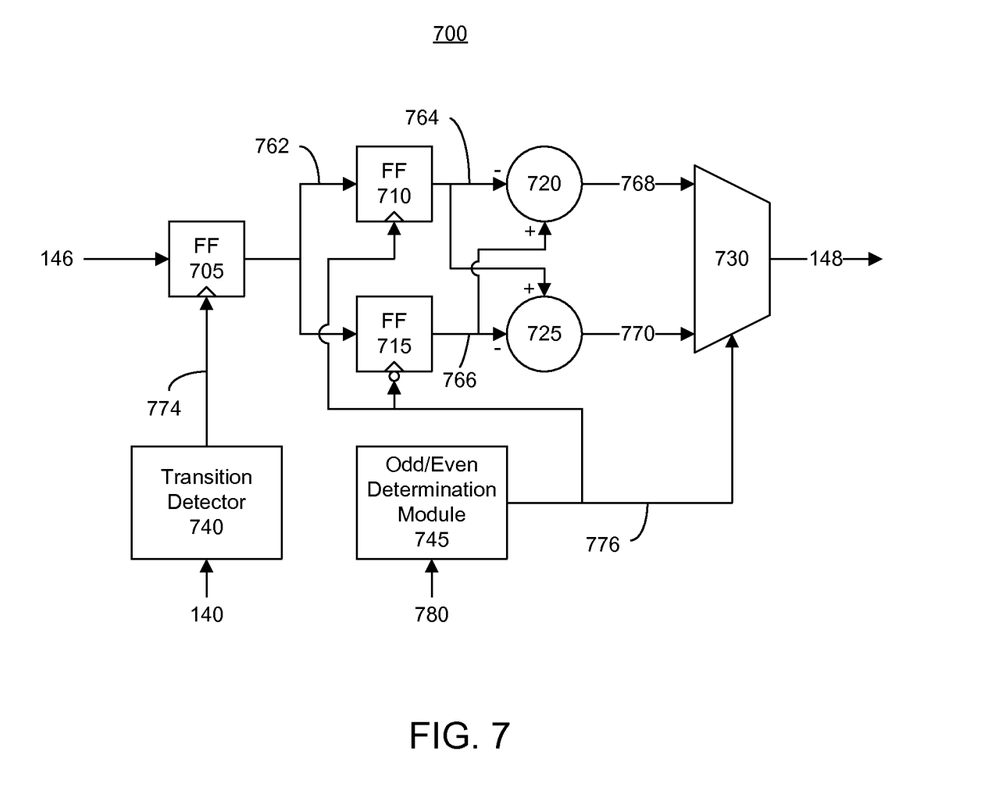
FIG. 7 is a block diagram illustrating a pattern error detector in accordance with another embodiment disclosed within this specification.

FIG. 7 is a block diagram illustrating a pattern error detector 700 in accordance with another embodiment disclosed within this specification. Pattern error detector 700 is an exemplary architecture that can be used to implement the pattern error detector 120 of FIG. 1. Pattern error detector 700, for example, can be used to detect 2 UI periodic distortion.

As shown, pattern error detector 700 can include a flip-flop (FF) 705 configured to receive output signal 146. As noted, output signal 146 is output from controlled oscillator 115 and specifies the phase of the clock signal recovered from input signal 140. As shown, FF 705 is clocked by signal 774, which is generated and output from transition detector 740.

Transition detector 740 receives input signal 140. Transition detector 740 can detect each transition, e.g., each rising and falling edge, of input signal 140. Responsive to detecting a transition, transition detector 740 can generate an indication via signal 774, which is provided to FF 705 as a clock signal.

FF 705 generates and outputs signal 762, which is provided to each of flip-flops (FFs) 710 and 715. FF 710 latches the value of input signal 762 according to signal 776, which is used by FF 710 as a clock signal. FF 715 latches the value of input signal 762 according to the inverse of signal 776, which is used by FF 715 as a clock signal.

FF 710 generates signal 764, which specifies the latched value from signal 762, and provides signal 764 to difference module 720 and difference module 725. Similarly, FF 715 generates signal 766, which specifies the latched value from signal 762, and provides signal 766 to difference module 725 and difference module 720. Difference module 720 determines a difference between signal 766 and signal 764. The result is provided to multiplexer 730 in the form of signal 768. Difference module 725 determines a difference between signal 764 and signal 766. The result from difference module 725 is provided to multiplexer 730 in the form of signal 770.

Multiplexer 730 selects either signal 768 or signal 770 and passes the selected signal as pattern error signal 148. Either signal 768 or signal 770 is selected and passed according to the value of signal 776, which is provided as a control signal from Odd/Even (OE) determination module 745. OE determination module 745 can receive signal 780. Signal 780 can be the most significant bit of output signal 146 from controlled oscillator 115. Accordingly, OE determination module 745 can determine whether each transition of the data signal 140, based upon the output from the controlled oscillator, occurs on an odd or an even cycle of the recovered clock signal. Thus, signal 776 indicates whether each transition that is detected is an odd transition or an even transition.

As shown, multiplexer 730 passes either signal 768 or signal 770 depending upon the value of signal 776. Thus, either signal 768 or signal 770 is passed as pattern error signal 148 as output from multiplexer 730 based upon whether the current transition that is detected is determined to be an odd transition or an even transition.

Figure 8:
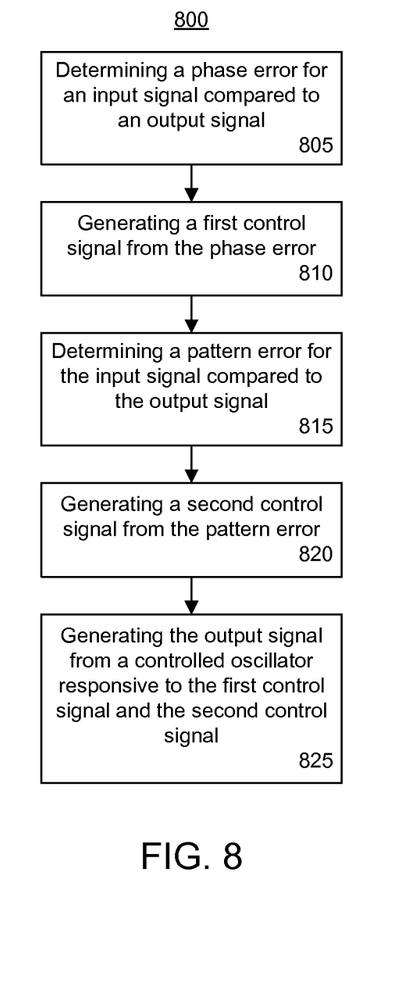
FIG. 8 is a flow chart illustrating a method of recovering a clock signal in accordance with another embodiment disclosed within this specification.

FIG. 8 is a flow chart illustrating a method 800 of recovering a clock signal in accordance with another embodiment disclosed within this specification. Method 800 can be performed by a system configured for performing CDR (a "CDR system") as described within this specification. Method 800 can begin in step 805, where the CDR system can determine a phase error for an input signal by comparing the input signal with an output signal, e.g., as generated from a controlled oscillator through a feedback path.

In step 810, the CDR system can generate a first control signal from the phase error. The first control signal indicates an amount by which to correct for phase error in the input signal. For example, the signal specifying the phase error can be filtered to generate the first control signal. In step 815, the CDR system can determine a pattern error for the input signal by comparing the input signal with the output signal. In step 820, the CDR system can generate a second control signal from the pattern error. The second control signal indicates an amount by which to correct for pattern error in the input signal. The second control signal can be generated, for example, by filtering a signal specifying the pattern error. In step 825, the CDR system can generate an output signal from a controlled oscillator responsive to the first control signals, the second control signal, and a center frequency signal. The center frequency signal can be adjusted as described within this specification.

For purposes of explanation, specific nomenclature is set forth to provide a thorough understanding of the various inventive concepts disclosed herein. The terminology used herein, however, is for the purpose of describing particular embodiments only and is not intended to be limiting. For example, reference throughout this specification to "one embodiment," "an embodiment," or similar language means that a particular feature, structure, or characteristic described in connection with the embodiment is included in at least one embodiment disclosed within this specification. Thus, appearances of the phrases "in one embodiment," "in an embodiment," and similar language throughout this specification may, but do not necessarily, all refer to the same embodiment.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowchart and block diagrams in the Figures illustrate the architecture, functionality, and operation of possible implementations of systems and methods according to various embodiments of the one or more embodiments disclosed herein. In this regard, each block in the flowchart or block diagrams may represent a module, segment, or portion of code, which includes one or more circuits, systems, and/or subsystems for implementing the specified operation(s) and/or function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The corresponding structures, materials, acts, and equivalents of all means or step plus function elements in the claims below are intended to include any structure, material, or act for performing the function in combination with other claimed elements as specifically claimed.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A system, comprising:
a phase detector configured to receive an input signal and an output signal and generate a phase error signal indicating a phase error by comparing the input signal and the output signal;
a first filter coupled to the phase detector and configured to generate a first control signal derived from the phase error signal;
a pattern error detector configured to receive the input signal and the output signal and generate a pattern error signal specifying a pattern error of the input signal by comparing the input signal and the output signal;
a second filter coupled to the pattern error detector and configured to generate a second control signal derived from the pattern error signal; and
a controlled oscillator coupled to the first filter and the second filter;
wherein the controlled oscillator is configured to generate the output signal responsive to the first control signal, the second control signal, and a center frequency signal;
wherein the controlled oscillator comprises:
an adder configured to add the first control signal, at least one bit from the output signal, and an adjusted center frequency signal and generate a sum;
an accumulator coupled to the adder and configured to generate the output signal; and
a center frequency adjustment module configured to adjust the center frequency where an average of the adjusted center frequency generated by the center frequency adjustment module is equal to the center frequency; and wherein the center frequency adjustment module comprises:
a second adder configured to add the second control signal with the center frequency signal and generate a second sum;
a difference module configured to subtract the second control signal from the center frequency signal and generate a difference; and
a multiplexer coupled to the second adder and the difference module and configured to pass either the second sum or the difference as the adjusted center frequency signal responsive to a control signal comprising at least one bit of the output signal.

2. The system of claim 1, further comprising:
a sampler coupled to the controlled oscillator and configured to sample the input signal responsive to the output signal from the controlled oscillator.

3. The system of claim 1, wherein the pattern error detector comprises a periodic unit interval error detector.

4. The system of claim 1, wherein the pattern error detector is configured to generate a first error signal and a second error signal different from the first error signal and select either the first error signal or the second error signal as the pattern error signal specifying a pattern error for each transition of the input signal; and
wherein the first error signal or the second error signal is selected according to whether the transition is an odd transition or an even transition.

5. A method, comprising:
determining a phase error for an input signal compared to an output signal;
generating a first control signal from the phase error;
determining a pattern error for the input signal compared to the output signal;
generating a second control signal from the pattern error;
using a controlled oscillator, generating the output signal responsive to the first control signal, the second control signal, and a center frequency signal;
wherein the output signal specifies a clock signal recovered from the input signal that is independent of transition density of the input signal;
accumulating a sum of the first control signal and a center frequency of the controlled oscillator with an accumulation result fed back from the accumulation;
adjusting the accumulation result according to the second control signal; and
summing the accumulation result and the adjusted accumulation result to generate the output signal.

6. The method of claim 5, wherein determining the pattern error further comprises:
determining a first error signal and a second error signal different from the first error signal; and
selecting either the first error signal or the second error signal as the pattern error signal specifying the pattern error for each transition of the input signal according to whether the transition is an odd transition or an even transition.

7. A controlled oscillator circuit, comprising:
an adder configured to add a first control signal, at least one bit from an output signal, and an adjusted center frequency signal and generate a first sum;
an accumulator coupled to the adder and configured to generate the output signal; and
a center frequency adjustment module configured to generate the adjusted center frequency signal by adjusting a center frequency signal according to a pattern error;

wherein the pattern error is determined from one of a plurality of different error signals selected for each transition of an input signal according to whether the transition of the input signal is an even transition or an odd transition; and wherein the center frequency adjustment module comprises:

a multiplexer configured to receive a plurality of candidate adjusted center frequency signals and pass a selected one of the candidate adjusted center frequency signals as the adjusted center frequency signal according to a second control signal derived from the output signal; and a plurality of adders, wherein each adder is configured to receive a different error signal specifying a different pattern error and add the error signal to the center frequency signal generating the plurality of candidate adjusted center frequency signals.

8. The oscillator of claim 7, wherein the first control signal is a phase error signal and the pattern error specified by the second control signal is a periodic unit interval error.

\* \* \* \* \*